(12) United States Patent
Kim et al.

(10) Patent No.: US 11,495,498 B2
(45) Date of Patent: Nov. 8, 2022

(54) SEMICONDUCTOR DEVICE AND TEST METHOD THEREOF

(71) Applicant: SK hynix Inc., Gyeonggi-do (KR)

(72) Inventors: Jihwan Kim, Seoul (KR); Sangmuk Oh, Gyeonggi-do (KR); Donguk Lee, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 223 days.

(21) Appl. No.: 16/890,190

(22) Filed: Jun. 2, 2020

(65) Prior Publication Data

US 2021/0193525 A1 Jun. 24, 2021

(30) Foreign Application Priority Data

Dec. 24, 2019 (KR) .................. 10-2019-0174014

(51) Int. Cl.
*H01L 21/822* (2006.01)
*G01R 31/26* (2020.01)
(Continued)

(52) U.S. Cl.
CPC ...... *H01L 21/8221* (2013.01); *G01R 31/2642* (2013.01); *G01R 31/2824* (2013.01);
(Continued)

(58) Field of Classification Search
CPC ....... H01L 21/8221; H01L 2225/06513; H01L 25/0657; H01L 2225/06541; H01L 25/0652; H01L 25/18; H01L 22/34; H01L 22/14; H01L 22/20; H01L 23/481; H01L 2924/00; H01L 2924/0002;
(Continued)

(56) References Cited

U.S. PATENT DOCUMENTS

2008/0089146 A1 4/2008 Fujito et al.
2011/0103151 A1 5/2011 Kim et al.
(Continued)

FOREIGN PATENT DOCUMENTS

KR 10-2010-0100409 A 9/2010
KR 10-2015-0097074 A 8/2015
(Continued)

OTHER PUBLICATIONS

Notice of Allowance issued by the USPTO for U.S. Appl. No. 16/928,157 dated Jun. 25, 2021.
(Continued)

*Primary Examiner* — Raul J Rios Russo
(74) *Attorney, Agent, or Firm* — IP & T Group LLP

(57) ABSTRACT

A semiconductor device may include: first to n-th through-electrodes; first to n-th through-electrode driving circuits suitable for charging the first to n-th through-electrodes to a first voltage level, or discharging the first to n-th through-electrodes to a second voltage level; and first to n-th error detection circuits, each suitable for storing the first voltage level or the second voltage level of a corresponding through-electrode of the first to n-th through-electrodes as a down-detection signal and an up-detection signal, and outputting a corresponding error detection signal of first to n-th error detection signals by sequentially masking the down-detection signal and the up-detection signal.

22 Claims, 9 Drawing Sheets

(51) Int. Cl.
*G01R 31/28* (2006.01)
*H01L 21/66* (2006.01)

(52) U.S. Cl.
CPC ..... *G01R 31/2831* (2013.01); *G01R 31/2884* (2013.01); *H01L 22/34* (2013.01); *H01L 2924/00* (2013.01); *H01L 2924/0002* (2013.01)

(58) Field of Classification Search
CPC ............ G01R 31/2642; G01R 31/2831; G01R 31/2856; G01R 31/2853; G01R 31/2884; G11C 29/021; G11C 29/44; G11C 2029/1206; G11C 2029/5602; G11C 29/1201; G11C 29/42; G11C 29/48; G11C 2029/1204; G11C 29/006; G11C 5/06; G11C 29/70
See application file for complete search history.

(56) References Cited

U.S. PATENT DOCUMENTS

| | | | | |
|---|---|---|---|---|
| 2012/0262196 | A1* | 10/2012 | Yokou | G01R 31/318513 324/750.3 |
| 2014/0344612 | A1* | 11/2014 | Yoko | G11C 29/025 713/400 |
| 2015/0270256 | A1 | 9/2015 | Edwards et al. | |
| 2017/0309209 | A1* | 10/2017 | Kenmotsu | G09G 3/006 |
| 2018/0247876 | A1* | 8/2018 | Kim | G11C 29/32 |
| 2019/0147790 | A1* | 5/2019 | Chung | G09G 3/2096 345/213 |
| 2021/0294476 | A1* | 9/2021 | Sasai | G06F 3/0445 |

FOREIGN PATENT DOCUMENTS

| | | |
|---|---|---|
| KR | 10-2017-0025988 A | 3/2017 |
| KR | 10-2017-0060205 | 6/2017 |
| KR | 10-2017-0094034 | 8/2017 |

OTHER PUBLICATIONS

Notice of Allowance for U.S. Appl. No. 16/910,803 issued by the USPTO dated May 24, 2022.

* cited by examiner

SEMICONDUCTOR DEVICE AND TEST METHOD THEREOF

CROSS-REFERENCE TO RELATED APPLICATIONS

The present application claims priority of Korean Patent Application No. 10-2019-0174014, filed on Dec. 24, 2019, which is herein incorporated by reference in its entirety.

BACKGROUND

1. Field

Various embodiments of the present disclosure relate to a semiconductor design technology, and more particularly, to a test method for a semiconductor device to be stacked.

2. Description of the Related Art

With the rapid development of semiconductor technology, the packaging technology for semiconductor integrated devices has required high integration and high performance. Therefore, a variety of techniques for a three-dimensional (3D) structure in which a plurality of semiconductor chips are vertically stacked have been developed, in addition to a two-dimensional (2D) structure in which semiconductor chips having integrated circuits formed therein are two-dimensionally arranged on a printed circuit board (PCB) through wires or bumps.

Such a 3D structure can be implemented through a stacked semiconductor device in which a plurality of semiconductor chips are vertically stacked. The semiconductor chips stacked in the vertical direction may be mounted on a semiconductor package substrate while being electrically connected to each other through a plurality of through-electrodes, for example, through-silicon vias (TSVs).

In the TSVs, various types of defects may occur. The defects may include a void which occurs when a TSV is not completely filled with a conductive material, a bump contact fail which occurs when a semiconductor chip is bent or a bump material is moved, and a crack of a TSV. Since the TSVs perform a function of electrically connecting the plurality of chips, the TSVs may not perform a normal function when middle parts of the TSVs are open. Therefore, any potential TSV defects need to be detected using a test.

SUMMARY

Various embodiments of the present disclosure are directed to a semiconductor device capable of detecting/verifying whether an error detection circuit for through-electrodes is operating normally.

In an embodiment, a semiconductor device may include: first to n-th through-electrodes; first to n-th through-electrode driving circuits suitable for charging the first to n-th through-electrodes to a first voltage level, or discharging the first to n-th through-electrodes to a second voltage level; and first to n-th error detection circuits, each suitable for storing the first voltage level or the second voltage level of a corresponding through-electrode of the first to n-th through-electrodes as a down-detection signal and an up-detection signal, and outputting a corresponding error detection signal of first to n-th error detection signals by sequentially masking the down-detection signal and the up-detection signal.

In an embodiment, a test method of a semiconductor device may include: outputting a plurality of error detection signals by storing a first voltage level of each of a plurality of through-electrodes as an up-detection signal while masking a down-detection signal, when charging the plurality of through-electrodes to the first voltage level; outputting the plurality of error detection signals by storing the first voltage level of each of the plurality of through-electrodes as the down-detection signal while masking the up-detection signal, when charging the plurality of through-electrodes to the first voltage level; outputting the error detection signals by storing a second voltage level of each of the plurality of through-electrodes as the up-detection signal while masking the down-detection signal, when discharging the plurality of through-electrodes to the second voltage level; and outputting the error detection signals by storing the second voltage level of each of the plurality of through-electrodes as the down-detection signal while masking the up-detection signal, when discharging the plurality of through-electrodes to the second voltage level.

In an embodiment, a semiconductor device may include: a plurality of through-electrodes; a through-electrode driving circuit suitable for charging the plurality of through-electrodes to a first voltage level, or discharging the plurality of through-electrodes to a second voltage level; a down-latch circuit suitable for storing the first voltage level or the second voltage level of each of the plurality of through-electrodes as a down-detection signal in response to a down-scan signal and a latch signal; an up-latch circuit suitable for storing the first voltage level or the second voltage level of each of the plurality of through-electrodes as an up-detection signal in response to an up-scan signal and the latch signal; a masking circuit suitable for sequentially masking the down-detection signal and the up-detection signal; and a decision circuit suitable for generating a plurality of error detection signals based on the down-detection signal and the up-detection signal, which are outputted from the masking circuit.

In an embodiment, a method for testing a plurality of semiconductor chips, each comprising a through-electrode and an error detection circuit for detecting a defect of the through-electrode, the method may comprise: driving the respective through-electrode with predetermined voltage levels; passing the predetermined voltage levels through the respective error detection circuit to generate detection signals; detecting a defect of the respective error detection circuit based on logic levels of the detection signals; stacking the plurality of semiconductor chips in a vertical direction; passing a source current through the through-electrodes of the stacked semiconductor chips in a downward direction of the stacked semiconductor chips to perform a down-scan operation; passing a source current through the through-electrodes of the stacked semiconductor chips in an upward direction of the stacked semiconductor chips to perform an up-scan operation; and determining a defect of the through-electrodes by the error detection circuits based on the down and up-scan operations.

These and other features and advantages of the present disclosure will become apparent to those skilled in the art of the invention from the following detailed description in conjunction with the following drawings.

DETAILED DESCRIPTION

Figure 1:
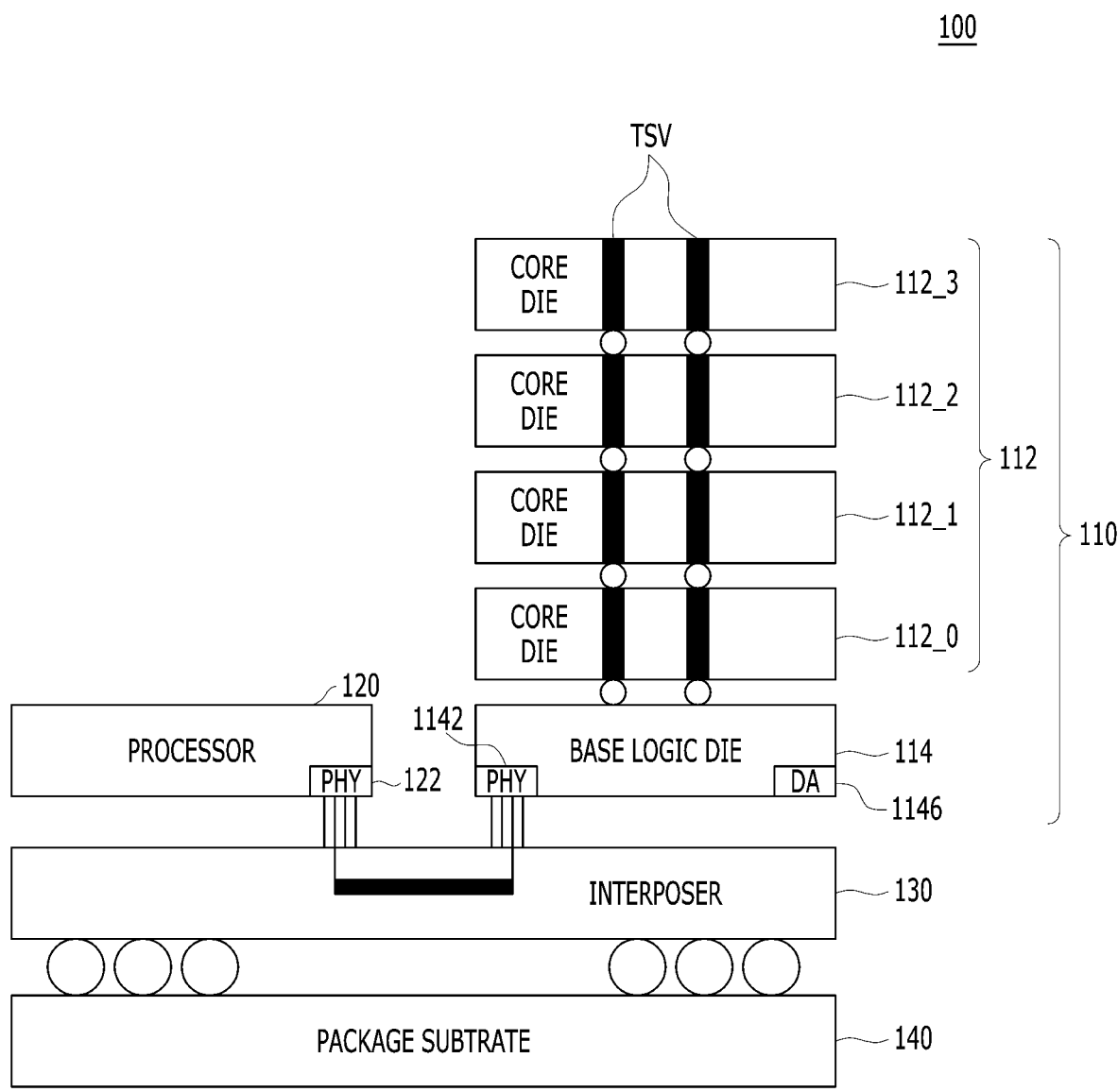
FIG. 1 is a cross-sectional diagram illustrating a semiconductor memory system in accordance with various embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically stated otherwise.

Hereafter, a semiconductor memory system will be described as an example of a stacked semiconductor device. A semiconductor memory system in accordance with an embodiment may be implemented in the form of a system-in-package (SIP) module, multi-chip-package (MCP) module or system-on-chip (SoC) module, or implemented in the form of a package-on-package (PoP) module including a plurality of packages.

FIG. 1 is a diagram illustrating a semiconductor memory system 100 in accordance with various embodiments of the present invention.

Referring to FIG. 1, the memory system 100 may include a stacked semiconductor device 110, a controller (or processor) 120, an interposer 130 and a package substrate 140.

The interposer 130 may be formed over the package substrate 140.

The stacked semiconductor device 110 and the controller 120 may be formed over the interposer 130.

Since the controller 120 is generally included in diverse processors, such as a Central Processing Unit (CPU), a Graphic Processing Unit (GPU), and an Application Processor (AP), the controller 120 may be also referred to as a processor as designated in FIG. 1.

A physical area (PHY) 1142 of the stacked semiconductor device 110 may be coupled to a physical area (PHY) 122 of the controller 120 via the interposer 130. An interface circuit for communication between the stacked semiconductor device 110 and the controller 120 may be disposed for each of the physical areas 1142 and 122.

The stacked semiconductor device 110 may form a High Bandwidth Memory (HBM). The HBM may have a high bandwidth corresponding to the increased number of I/O units caused by stacking a plurality of dies (i.e., semiconductor chips) in a vertical direction and electrically connecting the dies through through-electrodes TSVs.

The plurality of dies may include a base logic die 114 (also referred to as base die) and a plurality of core dies 112. The core dies 112 may be sequentially stacked over the base logic die 114, and coupled to each other through the through-electrodes TSVs. Although FIG. 1 shows that four core dies 112, that is, first to fourth core dies 112_0 to 112_3, are stacked, the concept and spirit of the present invention are not limited thereto and the number of the stacked core dies may vary depending on the design of the semiconductor device.

Each of the core dies 112 may be implemented with a memory chip. Each of the core dies 112 may include a plurality of memory cells for storing data and circuits for supporting a core operation on the memory cells. The base logic die 114 may act as an interface between the core dies 112 and the controller 120 so that various functions within the semiconductor system 100 may be performed. The various functions may include, for example, a memory management function (e.g., a refresh management function and a power management function for the memory cells), and a timing adjustment function between the core dies 112 and the controller 120.

The base logic die 114 may include the physical area 1142 and a direct access area (DA) 1146. In the physical area 1142, an interface circuit for communication with the controller 120 may be disposed. In the direct access area 1146, an interface circuit for directly testing the stacked semiconductor device 110 may be disposed. The base logic die 114 may be also referred to as a buffer die.

Figure 2:
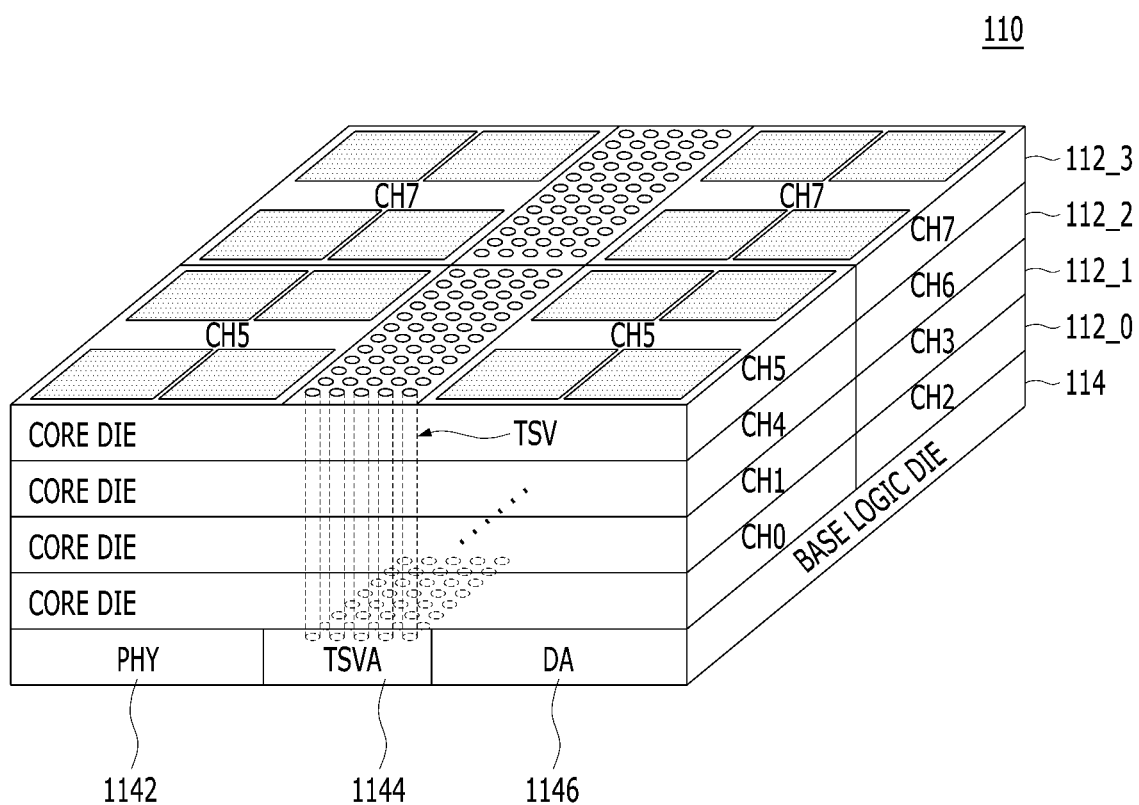
FIG. 2 is a perspective view illustrating a stacked semiconductor device shown in FIG. 1 in accordance with various embodiments of the present invention.

FIG. 2 is a perspective view of the stacked semiconductor device 110 shown in FIG. 1.

Referring to FIG. 2, each of the first to fourth core dies 112_0 to 112_3 may include one or more channels. In the example of FIG. 2, each core die includes two channels, and, therefore, the stacked semiconductor device 110 includes first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs passing through the first to fourth core dies 112_0 to 112_3 may be disposed to correspond to the first to eighth channels CH0 to CH7, respectively. When each channel has a bandwidth of 128 bits (i.e., two 128-bit channels per die), the through-electrodes TSVs and corresponding I/O units may be configured to transfer 1024 bits of data. Each channel may be similar to a standard DDR interface. Each channel may be completely independent. Each channel within one stacked semiconductor device and, even within one die, may operate at different frequency and/or different timings.

The base logic die 114 may communicate with the controller 120 (see FIG. 1). For example, the base logic die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114.

The physical area 1142 may be provided with an I/O circuit for interfacing with the controller 120. The physical area 1142 may be disposed in a first edge area of the base logic die 114, adjacent to the controller 120. The direct access area 1146 may be provided with an I/O circuit for directly interfacing with an external test device (not shown). The direct access area 1146 may be disposed in a second edge area of the base logic die 114, adjacent to the external test device. The second edge area may be disposed in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at the central area of the base logic die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 to transfer the buffered signals to the first to fourth core dies 112_0 to 112_3 through the through-electrodes TSVs.

Since the through-electrodes TSVs need to guarantee physical connections, the through-electrodes TSVs need to pass a test, for example, an open/short (OS) test. When defects are detected during the OS test which is performed on the through-electrodes TSVs connected in the column direction, the through-electrodes TSVs having the defects may be substituted with redundant through-electrodes.

Figure 3:
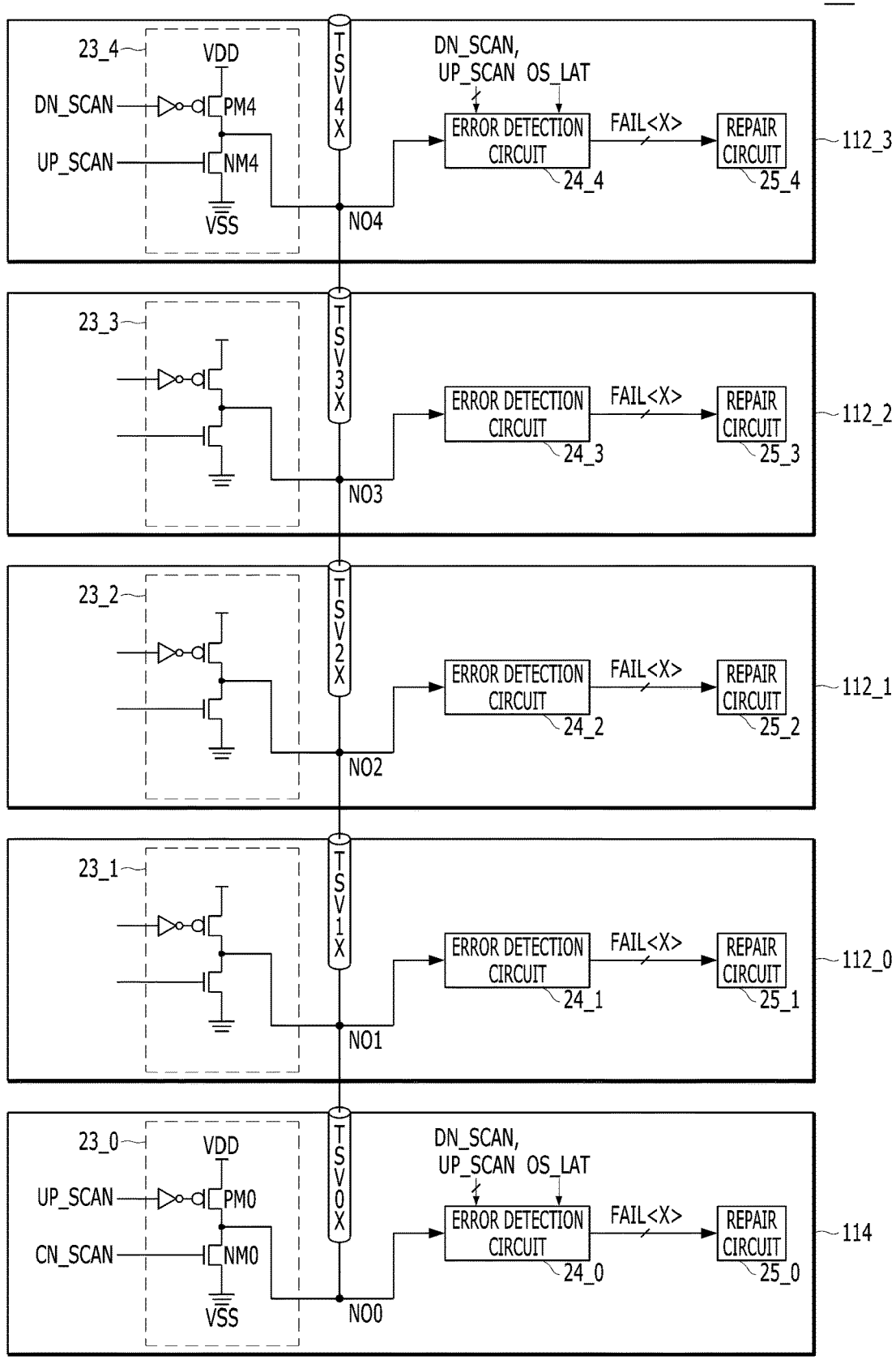
FIG. 3 is a diagram illustrating a configuration for testing a stacked semiconductor device in accordance with various embodiments of the present invention.

FIG. 3 is a diagram illustrating a configuration for testing the stacked semiconductor device 110 shown in FIG. 2.

Referring to FIG. 3, the stacked semiconductor device 110 may include a base logic die 114 and a plurality of core dies 112_0 to 112_3, which are stacked and communicate with channels allocated through a plurality of through-electrodes TSV0X to TSV4X. The core dies 112_0-112_3 may be stacked in a vertical direction as shown in FIG.3. However, the core dies 112_0-112_3 may be stacked in a horizontal direction in another embodiment without departing from the scope of the present invention. For the convenience of description, though FIG. 3 illustrates through-electrodes TSV0X to TSV4X, one for each core die in the column direction, a plurality of through-electrodes may be formed for each core die.

The first to fourth core dies 112_0 to 112_3 may include through-electrode scan circuit 23_1 to 23_4 and error detection circuits 24_1 to 24_4, respectively.

The through-electrode scan circuits 23_1 to 23_4 may perform a down-scan and an up-scan on the through-electrodes TSV0X to TSV4X connected in the column direction among the through-electrodes. The down-scan may indicate passing a signal in the downward direction through the through-electrodes TSV0X to TSV4X, and the up-scan may indicate passing a signal in the upward direction through the through-electrodes TSV0X to TSV4X. The error detection circuits 24_1 to 24_4 may detect whether the through-electrodes TSV0X to TSV4X have defects, based on the down-scan and the up-scan.

Each of the through-electrode scan circuits 23_1 to 23_4 may include a down-scan unit and an up-scan unit. The down-scan unit may perform the down-scan by flowing a current downward through the through-electrodes TSV0X to TSV4X connected in the column direction. The down-scan unit may include a current source PM4. The current source PM4 may provide a source current to one terminal NO1 to NO4 of the through-electrodes TSV1X to TSV4X in response to a down-scan signal DN_SCAN. The up-scan unit may perform the up-scan by flowing a current upward through the through-electrodes TSV0X to TSV4X connected in the column direction. The up-scan unit may include a current sink NM4. The current sink NM4 may sink signals transmitted through the terminals NO1 to NO4 of the through-electrodes TSV1X to TSV4X in response to an up-scan signal UP_SCAN. For reference, since the down-scan signal DN_SCAN and the up-scan signal UP_SCAN are activated to a logic high level, the down-scan unit may further include an inverter for driving the current source PM4 composed of a PMOS transistor.

The error detection circuits 24_1 to 24_4 may store a down-scan result as a first value according to the down-scan signal DN_SCAN and a latch signal OS_LAT, and may store an up-scan result as a second value according to the up-scan signal UP_SCAN and the latch signal OS_LAT. The error detection circuits 24_1 to 24_4 then may combine the stored first and second values to generate a fail determination signal FAIL<X> indicating whether the through-electrodes TSV0X to TSV4X have defects.

The base logic die 114 may include a through-electrode scan circuit 23_0 and an error detection circuit 24_0. The through-electrode scan circuit 23_0 may include a current sink NM0 and a current source PM0. The current sink NM0 may sink a signal transmitted in the downward direction through one terminal NO0 of the through-electrode TSV0X in response to the down-scan signal DN_SCAN. The current source PM0 may provide a source current corresponding to a signal transmitted in the upward direction to the terminal NO0 of the through-electrode TSV0X in response to the up-scan signal UP_SCAN. The current source PM0 of the base logic die 114 may be turned on in response to the up-scan signal UP_SCAN, while the current source PM4 of the first to fourth core dies 112_0 to 112_3 may be turned on in response to the down-scan signal DN_SCAN. Accordingly, the current source PM0 may complementarily operate to the current source PM4. Likewise, the current sink NM0 of the base logic die 114 may be turned on in response to the down-scan signal DN_SCAN, while the current sink NM4 of the first to fourth core dies 112_0 to 112_3 may be turned on in response to the up-scan signal UP_SCAN. Accordingly, the current sink NM0 may complementarily operate to the current sink NM4. The error detection circuit 24_0 may have substantially the same configuration as each of the error detection circuits 24_1 to 24_4 of the first to fourth core dies 112_0 to 112_3.

The base logic die 114 and the first to fourth core dies 112_0 to 112_3 may include repair circuits 25_0 to 25_4. The repair circuits 25_0 to 25_4 may detect defects of the through-electrodes TSV0X to TSV4X based on the fail determination signal FAIL<X>, and replace the detected defective through-electrodes with redundant through-electrodes (not shown).

During a boot-up operation or an initial operation, a chip identification (ID) signal may be allocated to each of the first to fourth core dies 112_0 to 112_3. For example, a chip ID signal of '00' may be allocated to the first core die 112_0, a chip ID signal of '01' may be allocated to the second core die 112_1, a chip ID signal of '10' may be allocated to the third core die 112_2, and a chip ID signal of '11' may be allocated to the fourth core die 112_3. According to an embodiment, using such a chip ID signal having stack information, the down-scan signal DN_SCAN and the up-scan signal UP_SCAN may be applied to the current source PM4 and the current sink NM4 included in a selected core die of the first to fourth core dies 112_0 to 112_3, while the current sources PM4 and the current sinks NM4 of unselected core dies may be floated.

Figure 4:
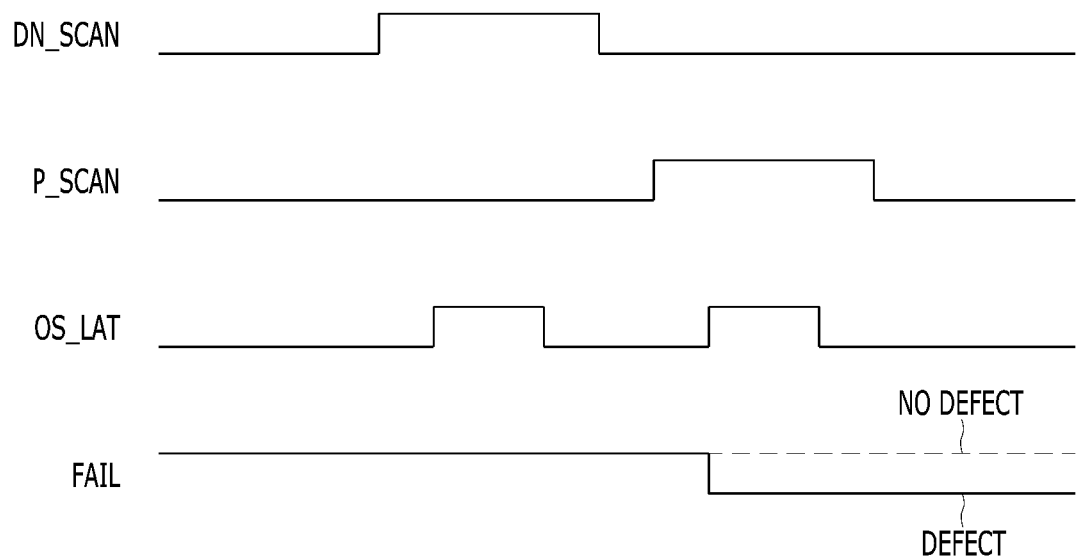
FIG. 4 is a timing diagram for describing an operation of an error detection circuit shown in FIG. 3 in accordance with various embodiments of the present invention.

FIG. 4 is a timing diagram for describing an operation of the error detection circuits 24_1 to 24_4 shown in FIG. 3.

Referring to FIG. 4, when the down-scan signal DN_SCAN is activated, the current source PM4 of the fourth core die 112_3 may provide a source current to one terminal NO4 of the through-electrode TSV4X, and the current sink NM0 of the base logic die 114 may sink a signal transmitted in the downward direction through one terminal NO0 of the through-electrode TSV0X. Thus, a down-scan for the through-electrode TSV0X to TSV4X may be performed. The error detection circuits 24_0 to 24_4 of each die may store the down-scan result as the first value according to the down-scan signal DN_SCAN and the latch signal OS_LAT.

When the up-scan signal UP_SCAN is activated, the current source PM0 of the base logic die 114 may provide a source current corresponding to a signal transmitted in the upward direction to the terminal NO0 of the through-electrode TSV0X, and the current sink NM4 of the fourth core die 112_3 may sink a signal transmitted through the terminal NO4 of the through-electrode TSV4X. Thus, an up-scan for the through-electrode TSV0X to TSV may be performed. The error detection circuits 24_0 to 24_4 of each die may store the up-scan result as the second value according to the up-scan signal UP_SCAN and the latch signal OS_LAT.

Finally, the error detection circuits 24_0 to 24_4 of each die may generate the fail determination signal FAIL<X> based on the first and second values. When any of the first and second values denotes that the through-electrodes TSV0X to TSV4X have defects, the error detection circuits 24_0 to 24_4 may output the fail determination signal FAIL<X> of a logic low level. If there is no defect in the through-electrodes TSV0X to TSV4X, the fail determination signal FAIL<X> may maintain a logic high level; otherwise the fail determination signal FAIL<X> may be deactivated to a logic low level. A test device (not illustrated), a controller (not illustrated) or the repair circuits 25_0 to 25_4 may determine whether the through-electrodes TSV0X to TSV4X have defects, based on the fail determination signal FAIL<X>.

As described above, the through-electrode scan circuits 23_0 to 23_4 and the error detection circuits 24_0 to 24_4 of each die may detect whether the through-electrodes TSV0X to TSV4X have defects by performing the down-scan and the up-scan on the through-electrodes TSV0X to TSV4X. However, when there is a defect in the error detection circuits 24_0 to 24_4, the fail determination signal FAIL<X> may be deactivated to a logic low level even if the through-electrodes TSV0X to TSV4X have no defect. In this case, an error analysis may become difficult and a chip manufacturing yield may be reduced due to an unnecessary repair.

Hereafter, a method capable of detecting/verifying an operation of an error detection circuit for performing a test for through-electrodes, before stacking a plurality of dies of a semiconductor device, will be described.

Figure 5:
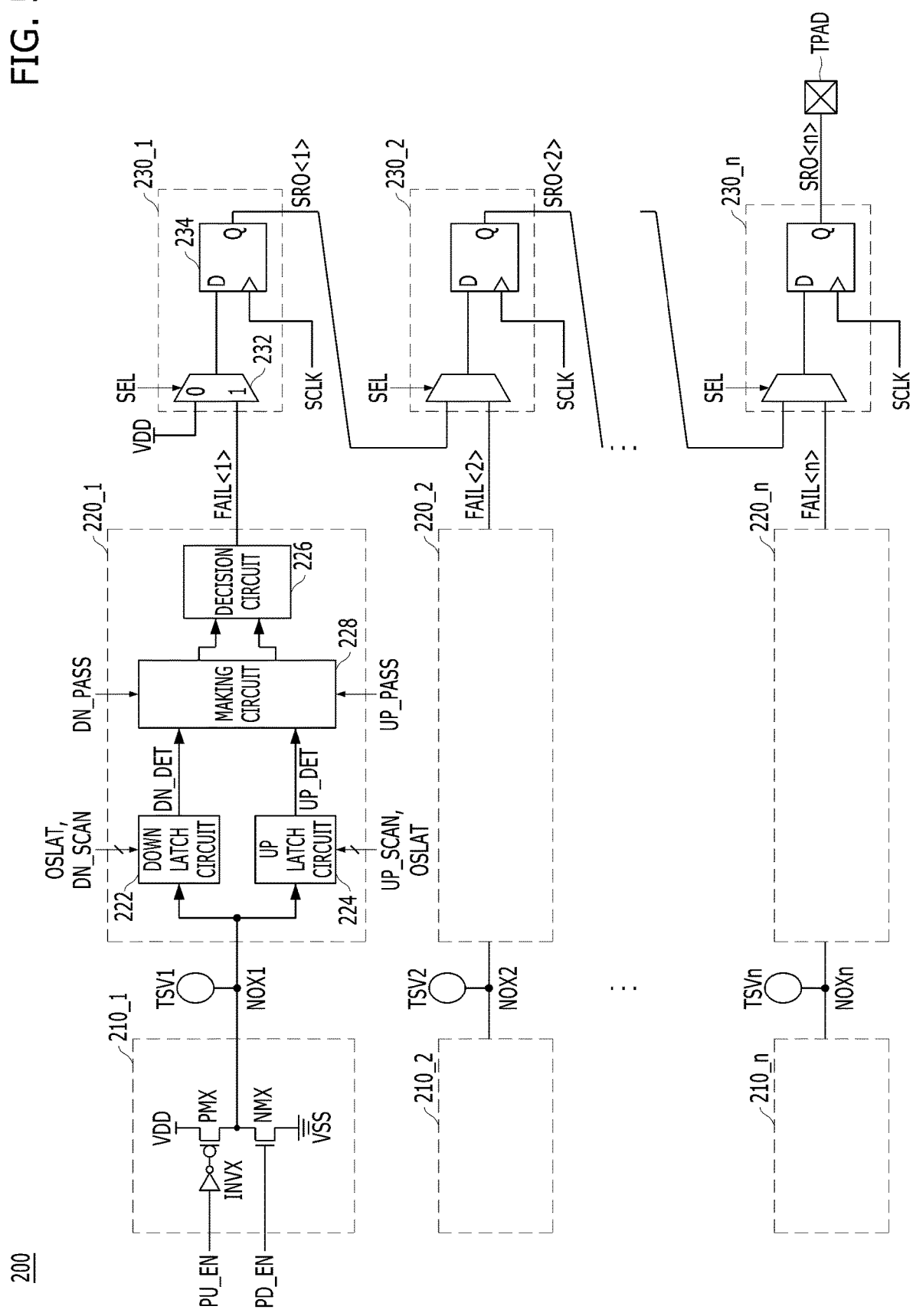
FIG. 5 is a circuit diagram illustrating a semiconductor device in accordance with various embodiments of the present invention.

FIG. 5 is a circuit diagram illustrating a semiconductor device 200 in accordance with various embodiments of the present invention. For reference, the semiconductor device 200 of FIG. 5 may correspond to each of the plurality of dies (i.e., the core dies and the base logic die) of FIGS. 1 to 3, before the dies are stacked. That is, the semiconductor device 200 of FIG. 5 may correspond to each of the dies at a wafer level.

Referring to FIG. 5, the semiconductor device 200 may include first to n-th through-electrodes TSV1 to TSVn, first to n-th through-electrode driving circuits 210_1 to 210_n, and first to n-th error detection circuits 220_1 to 220_n.

The first to n-th through-electrode driving circuits 210_1 to 210_n may be coupled to the first to n-th through-electrodes TSV1 to TSVn, respectively. Each of the first to n-th through-electrode driving circuits 210_1 to 210_n may be coupled to one terminal NOXI to NOXn of a corresponding one of the first to n-th through-electrodes TSV1 to TSVn. The first to n-th through-electrode driving circuits 210_1 to 210_n may charge the first to n-th through-electrodes TSV1 to TSVn to a first voltage level (e.g., a supply voltage (VDD) level), or discharge the first to n-th through-electrodes TSV1 to TSVn to a second voltage level (e.g., a ground voltage (VSS) level).

In an embodiment, each of the first to n-th through-electrode driving circuits 210_1 to 210_n may include a pull-up driver PMX and a pull-down driver NMX. The pull-up driver PMX may pull up a corresponding through-electrode to the first voltage level according to a pull-up driving signal PU_EN. For example, the pull-up driver PMX may be implemented with a PMOS transistor which is coupled between a supply voltage (VDD) terminal and one terminal of the corresponding through-electrode, and has a gate for receiving the pull-up driving signal PU_EN. The pull-down driver NMX may pull down a corresponding through-electrode to the second voltage level according to a pull-down driving signal PD_EN. For example, the pull-down driver NMX may be implemented with an NM0S transistor which is coupled between one terminal of the corresponding through-electrode and a ground voltage (VSS) terminal, and has a gate for receiving the pull-down driving signal PD_EN. Preferably, since the pull-up driving signal PU_EN and the pull-down driving signal PD_EN are activated to a logic high level, each of the first to n-th through-electrode driving circuits 210_1 to 210_n may further include an inverter INVX for driving the pull-up driver PMX composed of a PMOS transistor.

For reference, the first to n-th through-electrode driving circuits 210_1 to 210_n may correspond to the through-electrode scan circuit (e.g., 23_0 to 23_4) of each die shown in FIG. 3 after stacking the dies. The pull-up driver PMX and the pull-down driver NMX may correspond to the current source (e.g., PMO and PM4) and the current sink (e.g., NM0 and MM4) of each die shown in FIG. 3 after stacking the dies. That is, before stacking the dies, the first to n-th through-electrode driving circuits 210_1 to 210_n may pull up the corresponding through-electrode to the first voltage level, or may pull down the corresponding through-electrode to the second voltage level. After stacking the dies, the first to n-th through-electrode driving circuits 210_1 to 210_n may perform a down-scan and an up-scan on the through-electrodes (e.g., TSV0X to TSV4X) connected in the column direction as shown in FIG. 3.

The first to n-th error detection circuits 220_1 to 220_n may be coupled to the first to n-th through-electrodes TSV1 to TSVn, respectively. Each of the first to n-th error detection circuits 220_1 to 220_n may be coupled to one terminal NOXI to NOXn of a corresponding through-electrode of the first to n-th through-electrodes TSV1 to TSVn. Each of the first to n-th error detection circuits 220_1 to 220_n may store the voltage level of a corresponding through-electrode of the first to n-th through-electrodes TSV1 to TSVn as a down-detection signal DN_DET and an up-detection signal UP_DET, and output a corresponding error detection signal of first to n-th error detection signals FAIL<1:n> by sequentially masking the down-detection signal DN_DET and the up-detection signal UP_DET.

In an embodiment, each of the first to n-th error detection circuits 220_1 to 220_n may include a down-latch circuit 222, an up-latch circuit 224, a decision circuit 226 and a masking circuit 228. The down-latch circuit 222 may store the voltage level of the corresponding through-electrode as the down-detection signal DN_DET in response to a down-scan signal DN_SCAN and a latch signal OS_LAT. The up-latch circuit 224 may store the voltage level of the corresponding through-electrode as the up-detection signal UP_DET in response to an up-scan signal UP_SCAN and the latch signal OS_LAT. The decision circuit 226 may generate the corresponding error detection signal based on the down-detection signal DN_DET and the up-detection signal UP_DET. The masking circuit 228 may provide the down-detection signal DN_DET and the up-detection signal UP_DET to the decision circuit 226 by sequentially masking the down-detection signal DN_DET outputted from the down-latch circuit 222 and the up-detection signal UP_DET outputted from the up-latch circuit 224. The masking circuit 228 may mask the down-detection signal DN_DET according to a down masking signal DN_PASS, and mask the up-detection signal UP_DET according to an up-masking signal UP_PASS. The down masking signal DN_PASS and the up-masking signal UP_PASS may be sequentially activated. A detailed description for the down-latch circuit 222, the up-latch circuit 224, the decision circuit 226 and the masking circuit 228 will be described with reference to FIG. 6.

For reference, the first to n-th error detection circuits 220_1 to 220_n may correspond to the error detection circuit (24_0 to 24_4) of each die shown in FIG. 3 after stacking the dies. After stacking the dies, the down masking signal DN_PASS and the up-masking signal UP_PASS may be maintained to a predefined logic level. Accordingly, after stacking the dies, the first to n-th error detection circuits 220_1 to 220_n may perform a defect detection operation on the through-electrodes TSV0X to TSV4X according to the down-scan and the up-scan, regardless of the down masking signal DN_PASS and the up-masking signal UP_PASS.

The semiconductor device 200 may further include first to n-th shifting circuits 230_1 to 230_n. The first to n-th shifting circuits 230_1 to 230_n may correspond to the first to n-th error detection circuits 220_1 to 220_n, respectively. Each of the first to n-th shifting circuits 230_1 to 230_n may be coupled to a corresponding error detection circuit of the first to n-th error detection circuits 220_1 to 220_n. Each of the first to n-th shifting circuits 230_1 to 230_n may store an error detection signal outputted from the corresponding error detection circuit or a shifting signal outputted from a previous-positioned shifting circuit, among first to n-th shifting signals SRO<1> to SRO<n>, and provide the stored signal as a shifting signal to a next-positioned shifting circuit, according to a selection signal SEL and a shifting clock SCLK. For reference, the first shifting circuit 230_1, positioned at a first stage among the first to n-th shifting circuits 230_1 to 230_n, may receive a signal of a source voltage (VDD) level, instead of the shifting signal.

In an embodiment, each of the first to n-th shifting circuits 230_1 to 230_n may include a selector 232 and a shifter 234. The selector 232 may select one of the error detection signal FAIL<Y> and the shifting signal SRO<Y−1> in response to the selection signal SEL. The error detection signal FAIL<Y> may be outputted from the corresponding error detection circuit 220_Y (1≤Y≤n), among the first to n-th error detection circuits 220_1 to 220_n. The shifting signal SRO<Y−1> may be outputted from the previous-positioned shifting circuit 230_Y−1, among the first to n-th shifting circuits 230_1 to 230_n. For example, the selector of the second shifting circuit 230_2 may select one of the second error detection signal FAIL<2> and the first shifting signal SRO<1> in response to the selection signal SEL. The selector of the second shifting circuit 230_2 may select the second error detection signal FAIL<2> when the selection signal SEL has a logic high level, and may select the first shifting signal SRO<1> when the selection signal SEL has a logic low level. The shifter 234 may latch an output of the selector 232 and provide the latched signal as the shifting signal to the next-positioned shifting circuit, in response to the shifting clock SCLK. Preferably, the shifter 234 may be implemented with a flip-flop. The n-th shifting circuit 230_n, positioned at a last stage among the first to n-th shifting circuits 230_1 to 230_n, may output the n-th shifting signal SRO<n> to an external device (or to the outside) through a test pad TPAD.

According to the above-described configuration, the first to n-th shifting circuits 230_1 to 230_n may sequentially output the first to n-th error detection signals FAIL<1:n> of the first to n-th error detection circuits 220_1 to 220_n as the n-th shifting signal SRO<n>, according to a toggling of the shifting clock SCLK. The n-th shifting signal SRO<n> may be outputted to an external test device (not shown) through the test pad TPAD.

Figure 6:
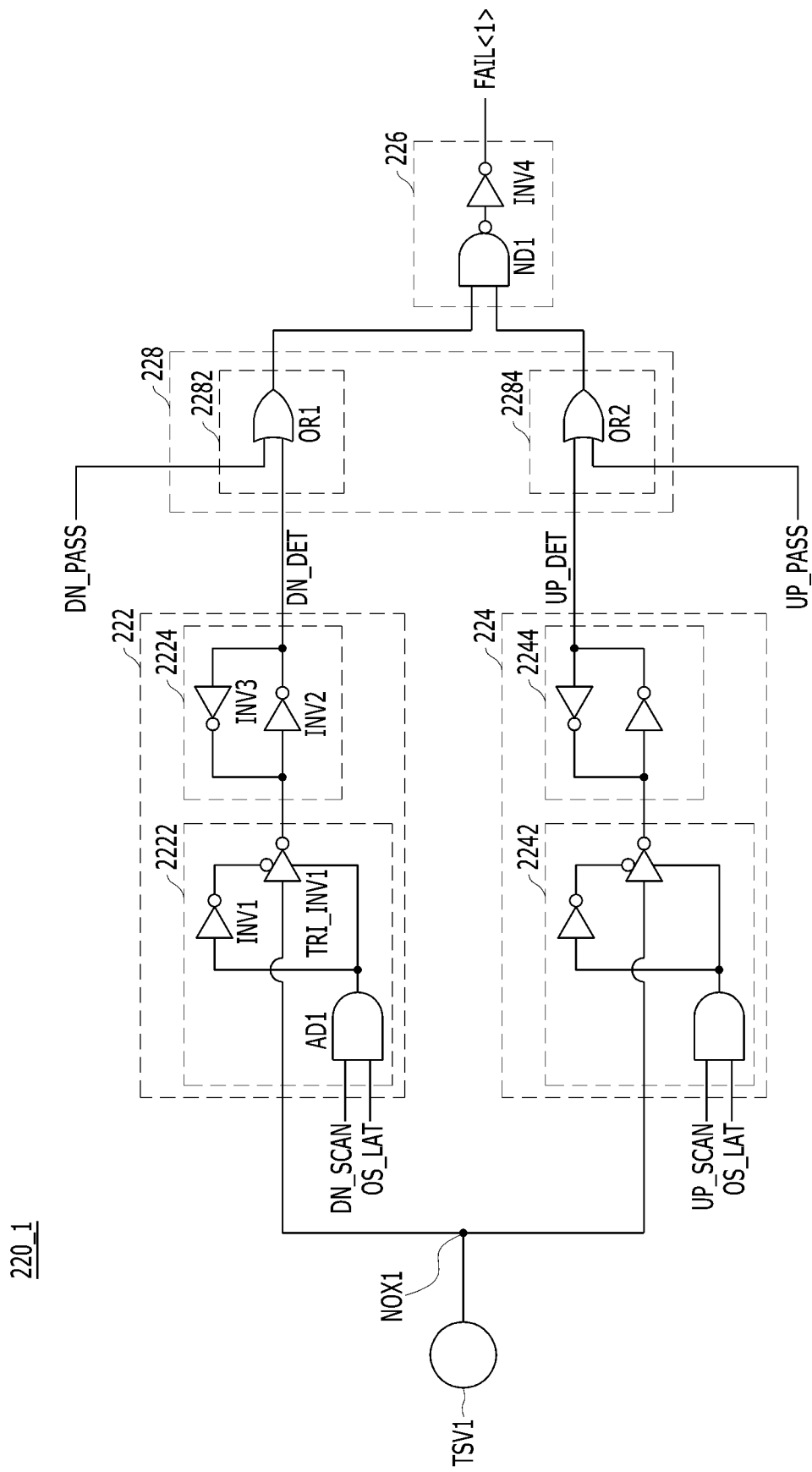
FIG. 6 is a detailed circuit diagram illustrating a first error detection circuit shown in FIG. 5 in accordance with various embodiments of the present invention.

FIG. 6 is a detailed circuit diagram illustrating the first error detection circuit 220_1 shown in FIG. 5. For reference, the second to n-th error detection circuits 220_2 to 220_n may have substantially the same configuration as the first error detection circuit 220_1.

Referring to FIG. 6, the down-latch circuit 222 of the first error detection circuit 220_1 may store the voltage level of the first through-electrode TSV1 as the down-detection signal DN_DET in response to the down-scan signal DN_SCAN and the latch signal OS_LAT. The down-latch circuit 222 may include a first transmitter 2222 and a first latch 2224. The first transmitter 2222 may transfer a signal provided from one terminal NOX1 of the first through-electrode TSV1, i.e., the voltage level of the first through-electrode TSV1 to the first latch 2224, based on the down-scan signal DN_SCAN and the latch signal OS_LAT. The first latch 2224 may latch the voltage level transferred from the first transmitter 2222 as the down-detection signal DN_DET.

For example, the first transmitter 2222 may include a first AND gate AD1, a first inverter INV1 and a first three-phase inverter TRI_INV1. The first AND gate AD1 may perform a logic AND operation on the down-scan signal DN_SCAN and the latch signal OS_LAT. The first inverter INV1 may invert an output of the first AND gate AD1. The first three-phase inverter TRI_INV1 may be enabled according to an output of the first AND gate AD1 and an output of the first inverter INV1, and invert the signal transmitted through the terminal NOX1 of the first through-electrode TSV1. The first latch 2224 may include cross-coupled inverters INV2 and INV3. According to the above-described configuration, the down-latch circuit 222 may store the signal provided from the terminal NOX1 of the first through-electrode TSV1 as the down-detection signal DN_DET, when both the down-scan signal DN_SCAN and the latch signal OS_LAT are activated.

The up-latch circuit 224 of the first error detection circuit 220_1 may store the voltage level of the first through-electrode TSV1 as the up-detection signal UP_DET in response to the up-scan signal UP_SCAN and the latch signal OS_LAT. The up-latch circuit 224 may include a second transmitter 2242 and a second latch 2244. The second transmitter 2242 may transfer a signal provided from one terminal NOX1 of the first through-electrode TSV1, i.e., the voltage level of the first through-electrode TSV1 to the second latch 2224, based on the up-scan signal UP_SCAN and the latch signal OS_LAT. The second latch 2244 may latch the voltage level transferred from the second transmitter 2242 as the up-detection signal UP_DET. The second transmitter 2242 and the second latch 2244 may have substantially the same configurations as the first transmitter 2222 and the first latch 2224, respectively. According to the above-described configuration, the up-latch circuit 224 may store the signal provided from the terminal NOX1 of the first through-electrode TSV1 as the up-detection signal UP_DET, when both the up-scan signal UP_SCAN and the latch signal OS_LAT are activated.

The decision circuit 226 of the first error detection circuit 220_1 may generate the first error detection signal FAIL<1> by combining the down-detection signal DN_DET outputted from the down-latch circuit 222 and the up-detection signal UP_DET outputted from the up-latch circuit 224. For example, the decision circuit 226 may include a NAND gate ND1 which performs a logic NAND operation on the down-detection signal DN_DET and the up-detection signal UP_DET to output the first error detection signal FAIL<1>.

The masking circuit 228 of the first error detection circuit 220_1 may sequentially mask the down-detection signal DN_DET outputted from the down-latch circuit 222 and the up-detection signal UP_DET outputted from the up-latch circuit 224. The masking circuit 228 may include a down masking circuit 2282 and an up-masking circuit 2284. The down masking circuit 2282 may mask the down-detection signal DN_DET according to the down masking signal DN_PASS. The up-masking circuit 2284 may mask the up-detection signal UP_DET according to the up-masking signal UP_PASS. Preferably, the down masking circuit 2282 and the up-masking circuit 2284 may be implemented with first and second OR gates OR1 and OR2, respectively. That is, the down masking circuit 2282 may mask the down-detection signal DN_DET to a logic high level when the down masking signal DN_PASS has a logic high level, and output the down-detection signal DN_DET when the down masking signal DN_PASS has a logic low level. The up-masking circuit 2284 may mask the up-detection signal UP_DET when the up-masking signal UP_PASS has a logic high level, and output the up-detection signal UP_DET when the up-masking signal UP_PASS has a logic low level. After stacking the dies (or the semiconductor devices), the down masking signal DN_PASS and the up-masking signal UP_PASS may be maintained to a logic low level, thereby preventing the masking operation from being performed by the masking circuit 228.

Before the stacking, the first to n-th error detection circuits 220_1 to 220_n may generate the first to n-th error detection signals FAIL<1:n> indicating whether the down-latch circuit 222 or the up-latch circuit 224 has defects. Further, after the stacking, the first to n-th error detection circuits 220_1 to 220_n may generate the first to n-th error detection signals FAIL<1:n> indicating whether the through-electrodes TSV0X to TSV4X (of FIG. 3) have defects, based on the down-scan and up-scan operations on the through-electrodes TSV0X to TSV4X connected in the column direction.

Hereinafter, referring to FIGS. 5 to 8, a test operation of the semiconductor device 200 in accordance with the present embodiment will be described.

Figure 7:
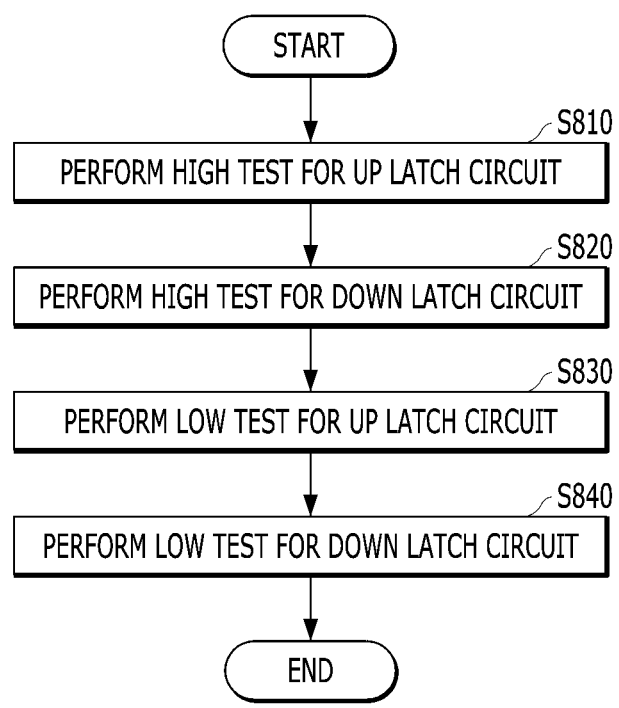
FIGS. 7 and 8 are a flow chart and a timing diagram for describing a test operation of a semiconductor device in accordance with various embodiments of the present invention.
Figure 8:
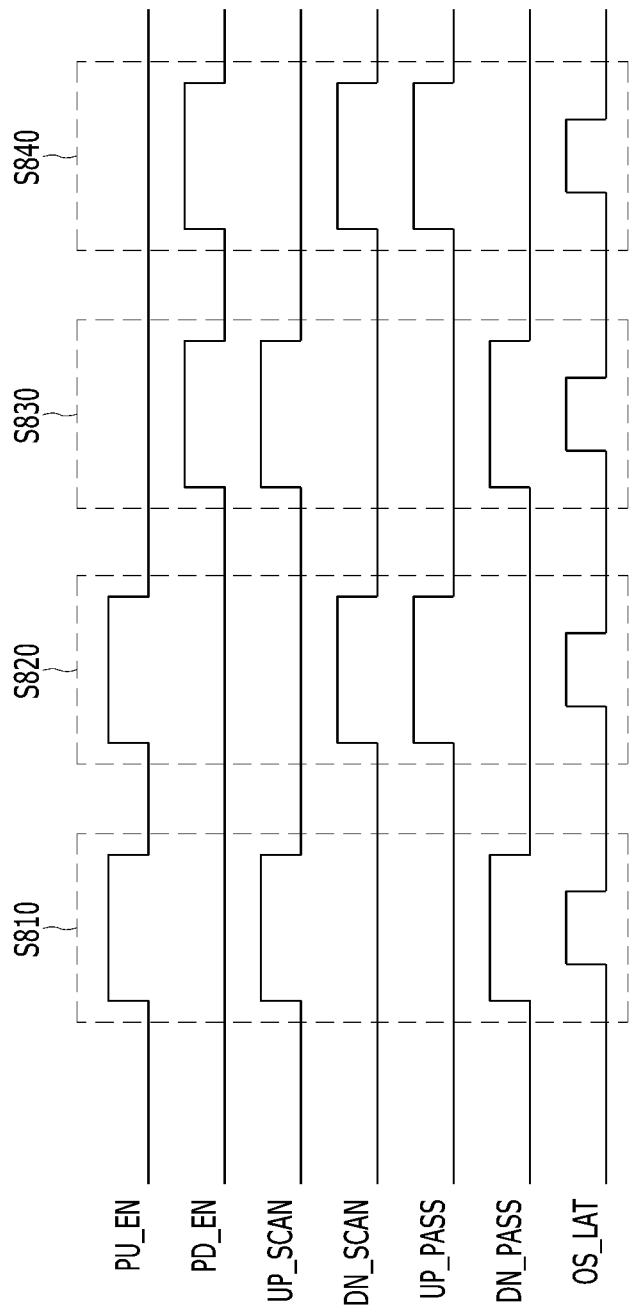

FIGS. 7 and 8 are a flow chart and a timing diagram for describing a test operation of a semiconductor device in accordance with various embodiments of the present invention.

Referring to FIGS. 7 and 8, a high test for the up-latch circuit 224 may be performed (step S810). For the high test, the first to n-th through-electrode driving circuits 210_1 to 210_n may charge the first to n-th through-electrodes TSV1 to TSVn to a first voltage level. As the pull-up driving signal PU_EN is activated, the first to n-th through-electrode driving circuits 210_1 to 210_n may pull up the first to n-th through-electrodes TSV1 to TSVn to a supply voltage VDD. Each of the first to n-th error detection circuits 220_1 to 220_n may store the voltage level of the corresponding through-electrode as the up-detection signal UP_DET while masking the down-detection signal DN_DET, thereby outputting the corresponding error detection signal.

In an embodiment, as the up-scan signal UP_SCAN and the latch signal OS_LAT are activated, the up-latch circuit 224 may store the voltage level of the corresponding through-electrode as the up-detection signal UP_DET. At this time, since the down masking signal DN_PASS is activated, the masking circuit 228 may mask the down-detection signal DN_DET. The decision circuit 226 may generate the corresponding error detection signal based on the down-detection signal DN_DET, which is masked to a logic high level, and the up-detection signal UP_DET. As a result, during the high test for the up-latch circuit 224, the first to n-th error detection signals FAIL<1:n> may be generated according to the up-detection signal UP_DET outputted from the up-latch circuit 224, regardless of an operation of the down-latch circuit 222.

Though not shown in FIG. 8, as the selection signal SEL transits to a logic high level and the shifting clock SCLK toggles one time, the first to n-th shifting circuits 230_1 to 230_n may store the first to n-th error detection signals FAIL<1:n>, respectively. Further, as the selection signal SEL transitions to a logic low level and the shifting clock SCLK toggles n times, the first to n-th shifting circuits 230_1 to 230_n may sequentially shift the first to n-th error detection signals FAIL<1:n> to output the n-th shifting signal SRO<n> to the outside through the test pad TPAD.

The external test device may monitor/detect whether the up-latch circuit 224 operates normally, based on the n-th shifting signal SRO<n>. For example, in the case where the first to n-th error detection signals FAIL<1:n> are sequentially outputted to a logic high level, the external test device may determine that all of the up-latch circuits 224 of the first to n-th error detection circuits 220_1 to 220_n operate normally. On the contrary, in a case where any of the first to n-th error detection signals FAIL<1:n> is outputted to a logic low level, the external test device may determine that the up-latch circuit 224 corresponding to the error detection signal having the logic low level operates abnormally. That is, the up-latch circuit 224 corresponding to the error detection signal having the logic low level may have defects.

Next, a high test for the down-latch circuit 222 may be performed (step S820). For the high test, the pull-up driving signal PU_EN may be activated, and thus the first to n-th through-electrode driving circuits 210_1 to 210_n may pull up the first to n-th through-electrodes TSV1 to TSVn to the supply voltage VDD. Each of the first to n-th error detection circuits 220_1 to 220_n may store the voltage level of the corresponding through-electrode as the down-detection signal DN_DET while masking the up-detection signal UP_DET, thereby outputting the corresponding error detection signal.

In an embodiment, as the down-scan signal DN_SCAN and the latch signal OS_LAT are activated, the down-latch circuit 222 may store the voltage level of the corresponding through-electrode as the down-detection signal DN_DET. At this time, since the up-masking signal UP_PASS is activated, the masking circuit 228 may mask the up-detection signal UP_DET. The decision circuit 226 may generate the corresponding error detection signal based on the down-detection signal DN_DET and the up-detection signal UP_DET which is masked to a logic high level. As a result, during the high test for the down-latch circuit 222, the first to n-th error detection signals FAIL<1:n> may be generated according to the down-detection signal DN_DET outputted from the down-latch circuit 222, regardless of an operation of the up-latch circuit 224.

Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD. The external test device may monitor/detect whether the down-latch circuit 222 operates normally, based on the n-th shifting signal SRO<n>.

Next, a low test for the up-latch circuit 224 may be performed (step S830). For the low test, the pull-down driving signal PD_EN may be activated and then the first to n-th through-electrode driving circuits 210_1 to 210_n may pull down the first to n-th through-electrodes TSV1 to TSVn to a ground voltage VSS. As the up-scan signal UP_SCAN, the latch signal OS_LAT and the down masking signal DN_PASS are activated, each of the first to n-th error detection circuits 220_1 to 220_n may store the voltage level of the corresponding through-electrode as the up-detection signal UP_DET while masking the down-detection signal DN_DET, thereby outputting the corresponding error detection signal. Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD.

The external test device may monitor/detect whether the up-latch circuit 224 operates normally, based on the n-th shifting signal SRO<n>. For example, in a case where the first to n-th error detection signals FAIL<1:n> are sequentially outputted to a logic low level, the external test device may determine that all of the up-latch circuits 224 of the first to n-th error detection circuits 220_1 to 220_n operate normally. On the contrary, in a case where any of the first to n-th error detection signals FAIL<1:n> is outputted to a logic high level, the external test device may determine that the up-latch circuit 224 corresponding to the error detection signal having the logic low level operates abnormally.

Next, a low test for the down-latch circuit 222 may be performed (step S840). For the low test, the pull-down driving signal PD_EN may be activated, and thus the first to n-th through-electrode driving circuits 210_1 to 210_n may pull down the first to n-th through-electrodes TSV1 to TSVn to the ground voltage VSS. As the down-scan signal DN_SCAN, the latch signal OS_LAT and the up-masking signal UP_PASS are activated, each of the first to n-th error detection circuits 220_1 to 220_n may store the voltage level of the corresponding through-electrode as the down-detection signal DN_DET while masking the up-detection signal UP_DET, thereby outputting the corresponding error detection signal. Thereafter, according to the selection signal SEL and the shifting clock SCLK, the first to n-th shifting circuits 230_1 to 230_n may respectively store and sequentially shift the first to n-th error detection signals FAIL<1:n> to output the n-th shifting signal SRO<n> to the outside through the test pad TPAD.

FIGS. 7 and 8 shows a case where the high test S810 for the up-latch circuit 224, the high test S820 for the down-latch circuit 222, the low test S830 for the up-latch circuit 224 and the low test S840 for the down-latch circuit 222 may be sequentially performed. However, the concept and spirit of the present invention are not limited thereto and a sequence of the tests S810 to S840 may be changed without departing from the scope of the invention. For example, in an embodiment, the high test S810 for the up-latch circuit 224, the low test S830 for the up-latch circuit 224, the high test S820 for the down-latch circuit 222, and the low test S840 for the down-latch circuit 222 may be sequentially performed in the recited order.

Figure 9:
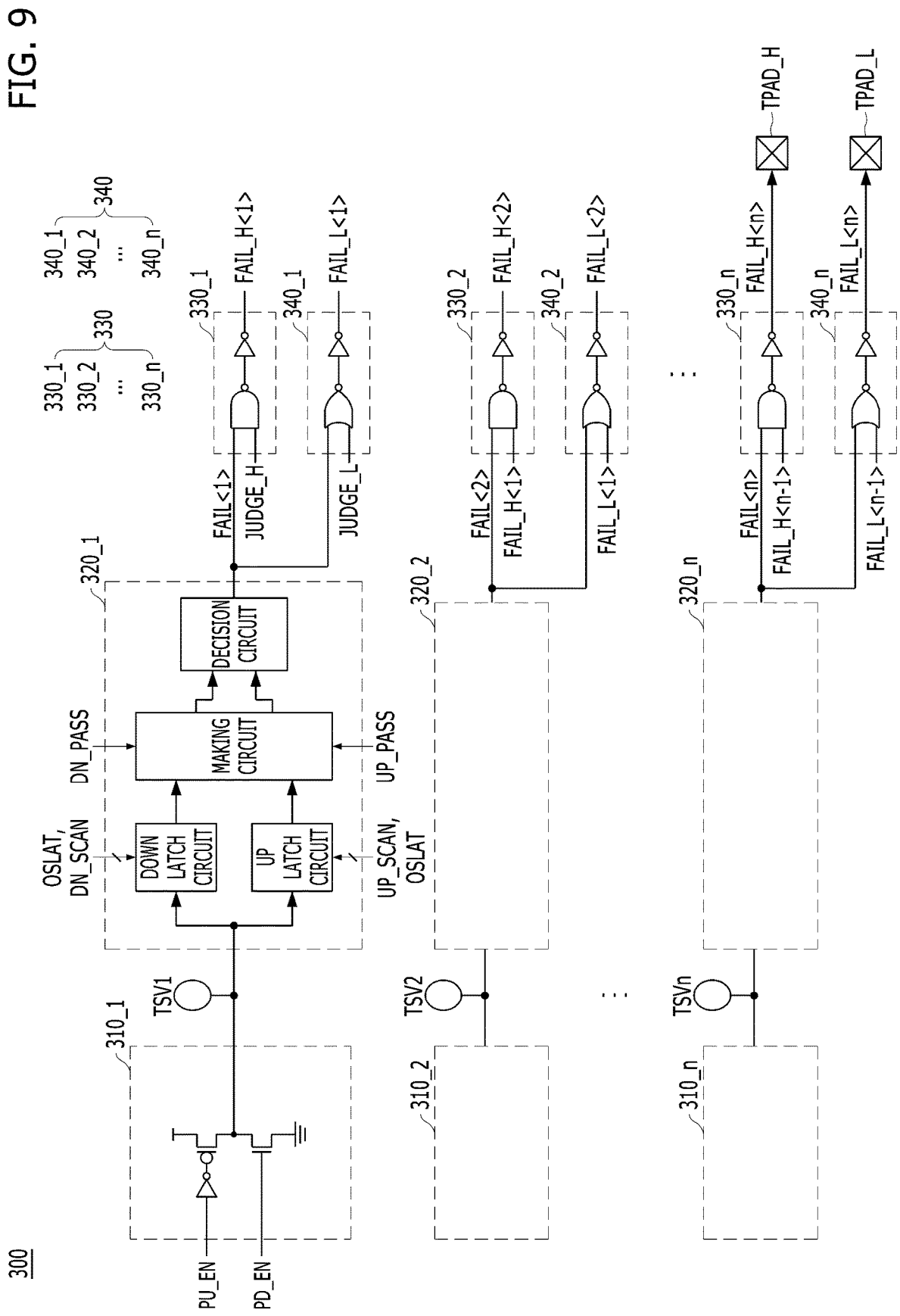
FIG. 9 is a circuit diagram illustrating a semiconductor device in accordance with various embodiments of the present invention.

FIG. 9 is a circuit diagram illustrating a semiconductor device 300 in accordance with various embodiments of the present invention.

Referring to FIG. 9, the semiconductor device 300 may include first to n-th through-electrodes TSV1 to TSVn, first to n-th through-electrode driving circuits 310_1 to 310_n, and first to n-th error detection circuits 320_1 to 320_n. The first to n-th through-electrode driving circuits 310_1 to 310_n and the first to n-th error detection circuits 320_1 to 320_n may have substantially the same configurations of FIG. 5.

Different from the semiconductor device 200 in FIG. 5, the semiconductor device 300 may compress first to n-th error detection signals FAIL<1:n> outputted from the first to n-th error detection circuits 320_1 to 320_n, thereby outputting first and second compression signals FAIL_H<n> and FAIL_L<n> at a time.

The semiconductor device 300 may include a first compression circuit 330 and a second compression circuit 340.

The first compression circuit 330 may compress the first to n-th error detection signals FAIL<1:n> to output the first compression signal FAIL_H<n>, when the first to n-th through-electrodes TSV1 to TSVn are charged to the first voltage level during a high test. The first compression circuit 330 may output the first compression signal FAIL_H<n> by performing a logic AND operation on the first to n-th error detection signals FAIL<1:n> according to a first judgement signal JUDGE_H. The first judgement signal JUDGE_H may be activated to a logic high level during the high test. The first compression signal FAIL_H<n> may be outputted to an external device (or to the outside) through a first test pad TPAD_H.

In an embodiment, the first compression circuit 330 may include first to n-th high compressors 330_1 to 330_n. The first to n-th high compressors 330_1 to 330_n may perform a logic AND operation on the first to n-th error detection signals FAIL<1:n> and signals FAIL_H<1:n−1> outputted from previous-positioned high compressors 330_1 to 330_n−1. The first high compressor 330_1 positioned at a first stage may perform a logic AND operation on the first error detection signal FAIL<1> and the first judgement signal JUDGE_H. The n-th high compressor 330_n positioned at a last stage may output the first compression signal FAIL_H<n> by performing a logic AND operation on the n-th error detection signal FAIL<n> and the signal FAIL_H<n−1> outputted from the (n−1)-th high compressor 330_n−1. FIG. 9 shows that each of the first to n-th high compressors 330_1 to 330_n is implemented with a NAND gate and an inverter. However, the concept and spirit of the present invention are not limited thereto and the first to n-th high compressors 330_1 to 330_n may be implemented with various logic circuits for performing a logic AND operation.

The second compression circuit 340 may compress the first to n-th error detection signals FAIL<1:n> to output the second compression signal FAIL_L<n>, when the first to n-th through-electrodes TSV1 to TSVn are discharged to the second voltage level during a low test. The second compression circuit 340 may output the second compression signal FAIL_L<n> by performing a logic OR operation on the first to n-th error detection signals FAIL<1:n> according to a second judgement signal JUDGE_L. The second judgement signal JUDGE_L may be activated to a logic low level during the low test. The second compression signal FAIL_L<n> may be outputted to the outside through a second test pad TPAD_L.

In an embodiment, the second compression circuit 340 may include first to n-th low compressors 340_1 to 340_n. The first to n-th low compressors 340_1 to 340_n may perform a logic OR operation on the first to n-th error detection signals FAIL<1:n> and signals FAIL_L<1:n−1> outputted from previous-positioned low compressors 340_1 to 340_n−1. The first low compressor 340_1 positioned at a first stage may perform a logic OR operation on the first error detection signal FAIL<1> and the second judgement signal JUDGE_L. The n-th low compressor 340_n positioned at a last stage may output the second compression signal FAIL_L<n> by performing a logic OR operation on the n-th error detection signal FAIL<n> and the signal FAIL_L<n−1> outputted from the (n−1)-th low compressor 340_n−1. FIG. 9 shows that each of the first to n-th low compressors 340_1 to 340_n is implemented with a NOR gate and an inverter. However, the concept and spirit of the present invention are not limited thereto and the first to n-th low compressors 340_1 to 340_n may be implemented with various logic circuits for performing a logic OR operation.

Hereinafter, referring to FIGS. 7 to 9, a test operation of the semiconductor device 300 in accordance with the present embodiment will be described.

First, a high test for an up-latch circuit may be performed (step S810). During the high test, the pull-up driving signal PU_EN may be activated, and the up-scan signal UP_SCAN, the latch signal OS_LAT, and the down masking signal DN_PASS may be activated. Accordingly, the first to n-th error detection signals FAIL<1:n> may be generated according to the up-detection signal UP_DET outputted from the up-latch circuit, regardless of an operation of a down-latch circuit. The first compression circuit 330 may perform a logic AND operation on the first to n-th error detection signals FAIL<1:n> to output the first compression signal FAIL_H<n>, when the first judgement signal JUDGE_H transits to a logic high level. An external test device may monitor/detect whether the up-latch circuit operates normally, based on the first compression signal FAIL_H<n> outputted through the first test pad TPAD_H. For example, in a case where the first compression signal FAIL_H<n> is outputted to a logic high level during the high test, the external test device may determine that all of the up-latch circuits of the first to n-th error detection circuits 320_1 to 320_n operate normally. On the contrary, in a case where the first compression signal FAIL_H<n> is outputted to a logic low level during the high test, the external test device may determine that at least one of the up-latch circuits operates abnormally.

Next, a high test for the down-latch circuit may be performed (step S820). Likewise, the first to n-th error detection signals FAIL<1:n> may be generated according to the down-detection signal DN_DET outputted from the down-latch circuit, regardless of an operation of the up-latch circuit. The first compression circuit 330 may perform a logic AND operation on the first to n-th error detection signals FAIL<1:n> to output the first compression signal FAIL_H<n>, when the first judgement signal JUDGE_H transitions to a logic high level. The external test device may monitor/detect whether the down-latch circuit operates normally, based on the first compression signal FAIL_H<n> outputted through the first test pad TPAD_H.

Next, a low test for the up-latch circuit may be performed (step S830). During the low test, the pull-down driving signal PD_EN may be activated, and the up-scan signal UP_SCAN, the latch signal OS_LAT, and the down masking signal DN_PASS may be activated. Accordingly, the first to n-th error detection signals FAIL<1:n> may be generated according to the up-detection signal UP_DET outputted from the up-latch circuit, regardless of an operation of a down-latch circuit. The second compression circuit 340 may perform a logic OR operation on the first to n-th error detection signals FAIL<1:n> to output the second compression signal FAIL_L<n>, when the second judgement signal JUDGE_L transitions to a logic low level. The external test device may monitor/detect whether the up-latch circuit operates normally, based on the second compression signal FAIL_L<n> outputted through the second test pad TPAD_L. For example, in a case where the second compression signal FAIL_L<n> is outputted to a logic low level during the low test, the external test device may determine that all of the up-latch circuits of the first to n-th error detection circuits 320_1 to 320_n operate normally. On the contrary, in a case where the second compression signal FAIL_L<n> is outputted to a logic high level during the low test, the external test device may determine that at least one of the up-latch circuits operates abnormally.

Next, a low test for the down-latch circuit may be performed (step S840). Likewise, the first to n-th error detection signals FAIL<1:n> may be generated according to the down-detection signal DN_DET outputted from the down-latch circuit, regardless of an operation of the up-latch circuit. The second compression circuit 340 may perform a logic OR operation on the first to n-th error detection signals FAIL<1:n> to output the second compression signal FAIL_L<n>, when the second judgement signal JUDGE_L transitions to a logic low level. The external test device may monitor/detect whether the down-latch circuit operates normally, based on the second compression signal FAIL_L<n> outputted through the second test pad TPAD_L.

According to an embodiment, a sequence of the tests S810 to S840 may be adjusted depending on the design option. The semiconductor device 200 of FIG. 5 may even identify the location of the error detection circuit in which a defect occurs. That is, the semiconductor device 200 may identify which of the plurality of error detection circuits has the defect. Although the semiconductor device 300 of FIG. 9 may not identify the location of the error detection circuit in which a defect occurs, the semiconductor device 300 may determine whether any of the error detection circuits has a defect, within a short period of time.

In accordance with the present embodiment, the semiconductor device can improve the overall chip manufacturing yield by detecting whether the error detection circuits for the through-electrodes operate normally. Further, the semiconductor device can reduce/minimize the unnecessary cost and time spent packaging/stacking the chips/dies by detecting the normal operation of the error detection circuit for the through-electrodes before stacking the chips/dies.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
   first to n-th through-electrodes;
   first to n-th through-electrode driving circuits suitable for charging the first to n-th through-electrodes to a first voltage level, or discharging the first to n-th through-electrodes to a second voltage level; and
   first to n-th error detection circuits, each suitable for storing the first voltage level or the second voltage level of a corresponding through-electrode of the first to n-th through-electrodes as a down-detection signal and an up-detection signal, and outputting a corresponding error detection signal of first to n-th error detection signals by sequentially masking the down-detection signal and the up-detection signal.

2. The semiconductor device of claim 1, further comprising:
   first to n-th shifting circuits, each suitable for storing an error detection signal outputted from a corresponding one of the first to n-th error detection circuits, or a shifting signal outputted from a previous-positioned shifting circuit, and providing the stored signal as the shifting signal to a next-positioned shifting circuit, according to a selection signal and a shifting clock.

3. The semiconductor device of claim 2, wherein each of the first to n-th shifting circuits includes:
   a selector suitable for selecting one of the error detection signal and the shifting signal in response to the selection signal; and
   a shifter suitable for latching an output of the selector and providing the latched signal as the shifting signal to the next-positioned shifting circuit, in response to the shifting clock.

4. The semiconductor device of claim 1, further comprising:
   a first compression circuit suitable for compressing the first to n-th error detection signals to output a first compression signal, when the first to n-th through-electrodes are charged to the first voltage level; and
   a second compression circuit suitable for compressing the first to n-th error detection signals to output a second compression signal, when the first to n-th through-electrodes are discharged to the second voltage level.

5. The semiconductor device of claim 4,
   wherein the first compression circuit outputs the first compression signal by performing a logic AND operation on the first to n-th error detection signals, and wherein the second first compression circuit outputs the second compression signal by performing a logic OR operation on the first to n-th error detection signals.

6. The semiconductor device of claim 1, wherein each of the first to n-th error detection circuits includes:
   a down-latch circuit suitable for storing the first voltage level or the second voltage level of the corresponding through-electrode as the down-detection signal in response to a down-scan signal and a latch signal;
   an up-latch circuit suitable for storing the first voltage level or the second voltage level of the corresponding through-electrode as the up-detection signal in response to an up-scan signal and the latch signal;
   a decision circuit suitable for generating the corresponding error detection signal based on the down-detection signal and the up-detection signal; and
   a masking circuit suitable for providing the down-detection signal and the up-detection signal to the decision circuit by sequentially masking the down-detection signal outputted from the down-latch circuit and the up-detection signal outputted from the up-latch circuit.

7. The semiconductor device of claim 6, wherein the down-latch circuit includes:
   a first transmitter suitable for transferring the first voltage level or the second voltage level of the corresponding through-electrode based on the down-scan signal and the latch signal; and
   a first latch suitable for latching the first voltage level or the second voltage level of the corresponding through-electrode transferred from the first transmitter as the down-detection signal.

8. The semiconductor device of claim 6, wherein the up-latch circuit includes:
   a second transmitter suitable for transferring the first voltage level or the second voltage level of the corresponding through-electrode based on the up-scan signal and the latch signal; and
   a second latch suitable for latching the first voltage level or the second voltage level of the corresponding through-electrode transferred from the second transmitter as the up-detection signal.

9. The semiconductor device of claim 6, wherein the masking circuit includes:
   a down masking circuit suitable for masking the down-detection signal according to a down masking signal; and
   an up-masking circuit suitable for masking the up-detection signal according to an up-masking signal,
   wherein the down masking signal and the up-masking signal are sequentially activated.

10. The semiconductor device of claim 1, wherein each of the first to n-th through-electrode driving circuits includes:
    a pull-up driver suitable for pulling up the corresponding through-electrode to the first voltage level according to a pull-up driving signal; and
    a pull-down driver suitable for pulling down the corresponding through-electrode to the second voltage level according to a pull-down driving signal.

11. A test method of a semiconductor device, comprising:
    outputting a plurality of error detection signals by storing a first voltage level of each of a plurality of through-electrodes as an up-detection signal while masking a down-detection signal, when charging the plurality of through-electrodes to the first voltage level;
    outputting the plurality of error detection signals by storing the first voltage level of each of the plurality of through-electrodes as the down-detection signal while masking the up-detection signal, when charging the plurality of through-electrodes to the first voltage level;

outputting the error detection signals by storing a second voltage level of each of the plurality of through-electrodes as the up-detection signal while masking the down-detection signal, when discharging the plurality of through-electrodes to the second voltage level; and outputting the error detection signals by storing the second voltage level of each of the plurality of through-electrodes as the down-detection signal while masking the up-detection signal, when discharging the plurality of through-electrodes to the second voltage level.

12. The test method of claim 11, further comprising:
sequentially shifting the error detection signals to output the shifted signal, according to a selection signal and a shifting clock.

13. The test method of claim 11, further comprising:
compressing the error detection signals to output a first compression signal, when the plurality of through-electrodes are charged to the first voltage level; and
compressing the error detection signals to output a second compression signal, when the plurality of through-electrodes are discharged to the second voltage level.

14. The test method of claim 13,
wherein the first compression signal is generated by performing a logic AND operation on the error detection signals, and
wherein the second compression signal is generated by performing a logic OR operation on the error detection signals.

15. A semiconductor device, comprising:
a plurality of through-electrodes;
a through-electrode driving circuit suitable for charging the plurality of through-electrodes to a first voltage level, or discharging the plurality of through-electrodes to a second voltage level;
a down-latch circuit suitable for storing the first voltage level or the second voltage level of each of the plurality of through-electrodes as a down-detection signal in response to a down-scan signal and a latch signal;
an up-latch circuit suitable for storing the first voltage level or the second voltage level of each of the plurality of through-electrodes as an up-detection signal in response to an up-scan signal and the latch signal;
a masking circuit suitable for sequentially masking the down-detection signal and the up-detection signal; and
a decision circuit suitable for generating a plurality of error detection signals based on the down-detection signal and the up-detection signal, which are outputted from the masking circuit.

16. The semiconductor device of claim 15, further comprising:
a plurality of shifting circuits, each suitable for storing a corresponding one of the error detection signals, or a shifting signal outputted from a previous-positioned shifting circuit according to a selection signal, and providing the stored signal as a shifting signal to a next-positioned shifting circuit, according to a shifting clock.

17. The semiconductor device of claim 16, wherein each of the shifting circuits includes:
a selector suitable for selecting one of the corresponding error detection signal and the shifting signal in response to the selection signal; and a shifter suitable for latching an output of the selector and providing the latched signal as the shifting signal to the next-positioned shifting circuit, in response to the shifting clock.

18. The semiconductor device of claim 15, further comprising:
a first compression circuit suitable for compressing the error detection signals to output a first compression signal, when the plurality of through-electrodes are charged to the first voltage level; and
a second compression circuit suitable for compressing the error detection signals to output a second compression signal, when the plurality of through-electrodes are discharged to the second voltage level.

19. The semiconductor device of claim 18,
wherein the first compression circuit outputs the first compression signal by performing a logic AND operation on the error detection signals, and
wherein the second first compression circuit outputs the second compression signal by performing a logic OR operation on the error detection signals.

20. The semiconductor device of claim 15, wherein the masking circuit includes:
a down masking circuit suitable for masking the down-detection signal according to a down masking signal; and
an up-masking circuit suitable for masking the up-detection signal according to an up-masking signal,
wherein the down masking signal and the up-masking signal are sequentially activated.

21. A method for testing a plurality of semiconductor chips, each comprising a through-electrode and an error detection circuit for detecting a defect of the through-electrode, the method comprising:
driving the respective through-electrode with predetermined voltage levels;
passing the predetermined voltage levels through the respective error detection circuit to generate detection signals;
detecting a defect of the respective error detection circuit based on logic levels of the detection signals;
stacking the plurality of semiconductor chips in a vertical direction;
passing a source current through the through-electrodes of the stacked semiconductor chips in a downward direction of the stacked semiconductor chips to perform a down-scan operation;
passing a source current through the through-electrodes of the stacked semiconductor chips in an upward direction of the stacked semiconductor chips to perform an up-scan operation; and
determining a defect of the through-electrodes by the error detection circuits based on the down and up-scan operations.

22. The method of claim 21, wherein the predetermined voltage levels include a first voltage level and a second voltage level greater than the first voltage level by a predetermined voltage,
the respective error detection circuit is provided with the first voltage level to generate a first detection signal,
the respective error detection circuit is provided with the second voltage level to generate a second detection signal, and
the defect of the respective error detection circuit is determined based on a logic level of each of the first and second detection signals.

* * * * *